(12) United States Patent
Pengelly et al.

(10) Patent No.: US 6,737,922 B2
(45) Date of Patent: May 18, 2004

(54) N-WAY RF POWER AMPLIFIER CIRCUIT WITH INCREASED BACK-OFF CAPABILITY AND POWER ADDED EFFICIENCY USING UNEQUAL INPUT POWER DIVISION

(75) Inventors: Raymond Sydney Pengelly, Hillsborough, NC (US); Simon Maurice Wood, Sunnyvale, CA (US)

(73) Assignee: Cree Microwave, Inc., Sunnyvale, CA (US)

( * ) Notice: Subject to any disclaimer, the term of this patent is extended or adjusted under 35 U.S.C. 154(b) by 0 days.

(21) Appl. No.: 10/430,461

(22) Filed: May 5, 2003

(65) Prior Publication Data

US 2003/0201833 A1 Oct. 30, 2003

Related U.S. Application Data

(63) Continuation-in-part of application No. 10/059,866, filed on Jan. 28, 2002.

(51) Int. Cl.[7] ............................. H03F 3/68; H03F 3/60
(52) U.S. Cl. ..................... 330/295; 330/124 R; 330/286
(58) Field of Search ............................ 330/295, 124 R, 330/286

(56) References Cited

U.S. PATENT DOCUMENTS

| | | | |
|---|---|---|---|
| 3,579,136 A | | 5/1971 | Machamer |
| 5,420,541 A | * | 5/1995 | Upton et al. ............... 330/286 |
| 5,739,723 A | * | 4/1998 | Sigmon et al. ............. 330/295 |
| 5,757,229 A | | 5/1998 | Mitzlaff |
| 5,786,727 A | | 7/1998 | Sigmon |
| 5,966,059 A | | 10/1999 | Sigmon |
| 6,097,252 A | | 8/2000 | Sigmon et al. |
| 6,262,629 B1 | | 7/2001 | Stengel et al. |
| 6,374,092 B1 | | 4/2002 | Leizerovich et al. |
| 6,396,341 B1 | | 5/2002 | Pehlke |
| 6,445,247 B1 | | 9/2002 | Walker |
| 6,448,616 B1 | | 9/2002 | Perugupalli et al. |

OTHER PUBLICATIONS

"The Dougherty Amplifier Product Review," Product Brochure, circa 1937.

* cited by examiner

*Primary Examiner*—Patricia Nguyen
(74) *Attorney, Agent, or Firm*—Beyer Weaver & Thomas, LLP

(57) ABSTRACT

An RF power amplifier circuit for amplifying an RF signal over a broad range of power with improved efficiency includes a carrier amplifier for amplifying an RF signal over a first range of power and with a power saturation level below the maximum of the broad range of power is disclosed. One or more peak amplifiers are connected in parallel with the carrier amplifier with each of the peak amplifiers being biased to sequentially provide an amplified output signal after the carrier amplifier approaches saturation. The input signal is applied through a signal splitter to the carrier amplifier and the plurality of peak amplifiers, and an output for receiving amplified output signals from the carrier amplifier and the plurality of peak amplifiers includes a resistive load R/2. The split input signal is applied through a 90° transformer to the carrier amplifier, and the outputs of the peak amplifiers are applied through 90° transformers to a output load. When operating below saturation, the carrier amplifier delivers power to a load of 2R when the carrier amplifier delivers current to the load, which is one-half the current at maximum power and the amplifier is saturated. The signal splitter can split the input signal power equally among the carrier and one or more peak amplifiers, or the input signal can be split unequally with the carrier amplifier receiving less input power than each of the peak amplifiers and vice versa.

20 Claims, 6 Drawing Sheets

Performance of Equal Split
180W Doherty Amplifier

*PAE at 7 dB back-off is 34%; PAE at 9dB back-off is 27%

Unequal power split (1.8 and 4.8 dB)

* Unequal power split with more power going to peak amplifier enables peak amplifier to be biased at threshold and hence improves backed off PAE (at 7dB) by 3% to 37%

3-way 90 watt Doherty with unequal power split

Performance of 3-way unequal split 90W Doherty Amplifier

*PAE at 7 dB back-off is 45% with $P_{1dB}$ of 90 watts
*PAE at 9 dB back-off is 35% with $P_{1dB}$ of 90 watts

N-WAY RF POWER AMPLIFIER CIRCUIT WITH INCREASED BACK-OFF CAPABILITY AND POWER ADDED EFFICIENCY USING UNEQUAL INPUT POWER DIVISION

CROSS-REFERENCE TO RELATED APPLICATIONS

This application is a continuation-in-part of U.S. patent application Ser. No. 10/059,866, filed Jan. 28, 2002, and entitled "N-Way RF Power Amplifier with Increased Back-off Power and Power Added Efficiency," the disclosure of which is hereby incorporated herein by reference in its entirety.

This application is related to U.S. patent application Ser. No. 10/430,568 filed May 5, 2003, and entitled "N-Way RF Power Amplifier Circuit with Increased Back-Off Capability and Power Added Efficiency Using Selected Phase Lengths and Output Impedances," the disclosure of which is hereby incorporated herein by reference in its entirety.

BACKGROUND OF THE INVENTION

This invention relates generally to RF power amplifier circuits, and more particularly the invention relates to an RF power amplifier circuit suitable for modern wireless communication systems, which require a wide range of output power in basestations where digital modulation is being employed.

Power amplifiers in basestations often operate at output power levels much lower than peak power. Unfortunately, the back-off power level reduces the efficiency of the power amplifier in the transmitter. In a conventional amplifier there is a direct relationship between efficiency and the input drive level. Therefore, high efficiency (DC to RF conversion efficiency) is not obtained until the RF input power level becomes sufficiently high to drive the amplifier into compression or saturation. Since in multicarrier communication systems an amplifier must remain as linear as possible, this region of high efficiency cannot be used.

A power amplifier circuit design which provides improved efficiency in back-off power levels is the Doherty amplifier circuit, which combines power from a main or carrier amplifier and from an auxiliary or peak amplifier. See, W. H. Doherty, "A New High-Efficiency Power Amplifier for Modulated Waves," Proc. IRE Vol. 24, No. 9, pp. 1163–1182 1936. In the conventional Doherty configuration, the carrier amplifier 10 and peak amplifier 12 are designed to deliver maximum power with optimum efficiency to a load R, as shown in FIG. 1A. The main or carrier amplifier is a normal Class B amplifier, while the peak amplifier is designed to only amplify signals which exceed some minimum threshold. For an LDMOS power transistor, this can be accomplished by DC biasing the transistor below its pinch-off voltage for operation similar to Class C. The outputs of the two amplifiers are connected by a quarter-wave transmission line of characteristic impedance R, and a load of one-half of the optimum load R is attached to the output of the peak amplifier. The RF input power is divided equally with a quarter-wave delay at the input to the peak amplifier, thus assuring that the output power of the two amplifiers at the load R/2 will be in phase.

The Doherty amplifier circuit achieves high efficiency prior to compression by operating the Class B carrier amplifier into an apparent load impedance two times larger than its optimum load. (Before the peak amplifier becomes active, the apparent load impedance presented to the carrier amplifier is 2R due to the presence of quarter wave transformer 14.) Thus, the carrier amplifier compresses and reaches peak efficiency at half of its maximum power. The second or peak amplifier becomes active only during the peaks of the input signal. When the peak amplifier is active, the load impedance apparent at the output of the carrier amplifier is reduced. Maximum efficiency is again achieved when the second amplifier puts out its full power. Thus, the first amplifier is kept on the verge of saturation for a 6 dB range of output power and near-peak efficiency can be maintained.

When the input RF power into the Doherty amplifier circuit is not sufficient to turn on the peak amplifier, all of the output power is supplied by the main or carrier amplifier. When the peak amplifier is off, its output impedance is very high and the output power of the carrier amplifier is entirely delivered to load R/2, as shown in FIG. 1B. As discussed above, the load actually presented to the carrier amplifier across the quarter-wave transformer 14 is 2R. The device current is therefore one-half of what is delivered at maximum power while the voltage is saturated. This results in the device delivering half its maximum output power. Since both the RF and DC components of the current are half their peak values, the efficiency will be at its maximum with half of the maximum output power of the carrier amplifier being supplied to the load with maximum linear efficiency.

When sufficient input RF power is provided to allow the peak amplifier to become saturated, as in FIG. 1A, two parallel amplifiers are evenly delivering maximum output power to the load R/2. The load apparent to each amplifier is then the optimum load R, and the load at both ends of the quarter-wave transformer will remain at R. The peak amplifier is designed to begin operation when the carrier amplifier just begins to saturate. Maximum linear efficiency is obtained at this point. As the input RF drive is further increased, the peak amplifier begins to turn on and deliver output power to the load. The additional current supplied by the peak amplifier has the effect of increasing the load impedance at the output of the quarter-wave transformer. The effective change at the carrier amplifier end of the transformer will be a reduction in the apparent load impedance and enabling the carrier amplifier to deliver more power while its voltage remains saturated. The efficiency between the limits will fall off only slightly from the maximum since the duty factor of the peak amplifier is relatively low.

Attempts have been made to extend the range of high efficiency operation of the Doherty amplifier circuit. For example, Iwamoto et al. have produced a 12 dB back-off circuit using scaled transistors or different sized transistors in the carrier and peak amplifiers and an unequal power splitter at the input. See, Iwamoto et al., "An Extended Doherty Amplifier with High Efficiency Over a Wide Power Range," 2001 IEEE MTT-S Digest, Phoenix, Ariz. This technique apparently works well when the total output power is low (less than 1 watt), but with limited improvement when the output power is in the 10 to 100 watt CW range.

There continues to be a need to extend the range of high efficiency operation for an RF power amplifier.

BRIEF SUMMARY OF THE INVENTION

In accordance with the invention, an RF power amplifier circuit includes a carrier amplifier for maximum back-off power operation and one or more peak amplifiers which are suitably biased to begin operation sequentially at increased power levels. Each peak amplifier can provide an increase of 6 dB in the power range over which the peak efficiency will be maintained. Since an N-way splitter is required for providing an input signal to the carrier amplifier and N−1 peak amplifiers, a finite loss of power in the splitter may limit some of the improvements in efficiency that can be realized. However, the use of peak amplifiers in high input power conditions may improve the overall efficiency of the circuit.

In one embodiment, a four-way amplifier circuit is provided and includes a carrier amplifier and three peak amplifiers all driven by a four-way power splitter. Theoretically, this amplifier may extend the range of efficient power by 18 dB. Such extension in efficient power range is very important in digital communication systems using modulation schemes such as wideband CDMA (W-CDMA) or OFDM where the peak to average power ratios can be as high as 13 dB. The four-way configuration may also provide an overall power increase of 3 dBm compared to a two-way amplifier arrangement. Thus a 120 watt peak amplifier can be provided by a four-way arrangement with each amplifier path (a carrier and three peak amplifiers) utilizing 30 watt transistors.

In accordance with another embodiment of the invention, input power is split and applied unequally to the carrier and one or more peak amplifiers to realize increased power added efficiency (PAE) and linearity. In one embodiment, each peak amplifier is provided an input signal level that is higher than the input signal level provided to the carrier amplifier. The peak amplifier can be pumped by the RF signal more efficiently than can be achieved using an equal power split, thus compensating for transconductance characteristics of the transistor close to threshold and increasing back-off capability for the same efficiency or improved linearity at the same back-off point. In a four-way Doherty arrangement, for example, four different RF power levels can be provided to the carrier and three peak amplifiers. The unequal split provides enhanced performance in back-off efficiency and linearity. In another embodiment, each peak amplifier is provided an input signal level that is less than the input signal level provided to the carrier amplifier.

The invention and objects and features thereof will be more readily apparent from the following detailed description and appended claims when taken with the drawings.

DETAILED DESCRIPTION OF THE INVENTION

The invention can be regarded as a modification of the Doherty power amplifier circuit with the addition of one or more peak amplifiers and the provision of an N-way splitter for the carrier amplifier and N−1 peak amplifiers. In order to ease the practical construction of the amplifier circuit, the Doherty amplifier quarter-wave transformers on the input to the peak amplifier and on the output of the carrier amplifier may be swapped, without affecting performance. However, in that case it will be appreciated by those skilled in the art that the impedance matching networks for the amplifiers should be adjusted to account for the relocation of the quarter-wave transformers. Only one single 90° (quarter-wave) phase length is needed on the carrie amplifier input, thus allowing easier implementation of multiple peak amplifiers through a multi-way power divider.

Figure 1A:
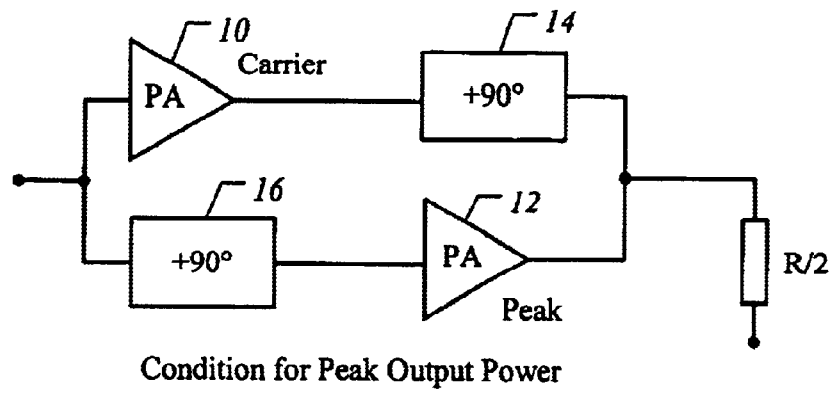
FIGS. 1A and 1B are schematics of a Doherty amplifier circuit.
Figure 1B:
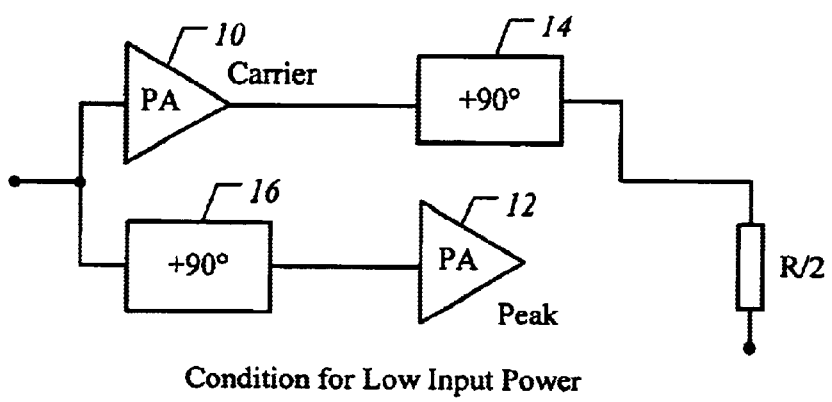
Figure 2:
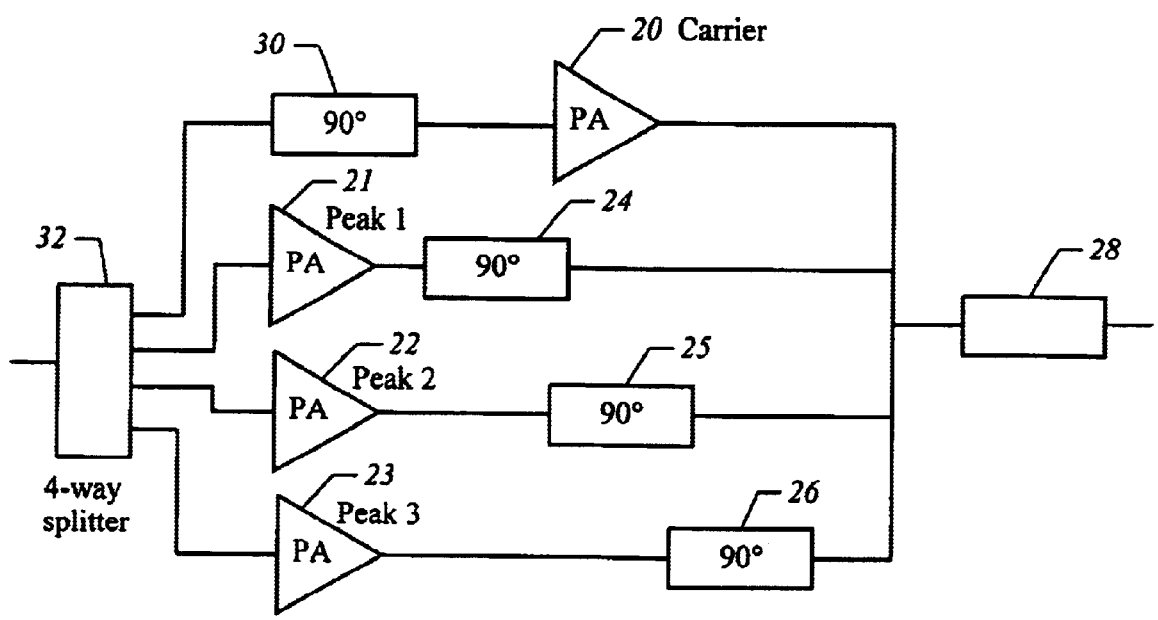
FIG. 2 is a schematic of a four-way Doherty power amplifier circuit in accordance with embodiments of the invention.

FIG. 2 is a functional block diagram of one embodiment of a power amplifier in accordance with an aspect of the invention, which includes a carrier amplifier 20 and the three peak amplifiers 21, 22, 23, with the peak amplifiers connected through 90° transformers 24, 25, 26 to output load 28. A single 90° transformer 30 connects a four-way splitter 32 to carrier 20. By setting the DC bias on each of the peak amplifiers to appropriate values, the added peak amplifiers allow the Doherty action to be extended. For each peak amplifier that is added above the first, there will be a corresponding increase of 6 dB in the power range over which the peak efficiency will be maintained. Some degradation in efficiency will result due to the finite loss in the N-way splitter. The four-way amplifier extends the range of efficient power to a theoretical value of 18 dB. As noted above, such extension is very important in digital communication systems using modulation schemes where the peak to average power ratios can be as high as 13 dB. The four-way configuration provides an overall power increase of 3 dBm compared to a two-way Doherty amplifier circuit. Thus, a 120 watt peak amplifier can be provided by a four-way Doherty arrangement with each path (a carrier and three peak amplifiers) utilizing 30 watt transistors.

Figure 3:
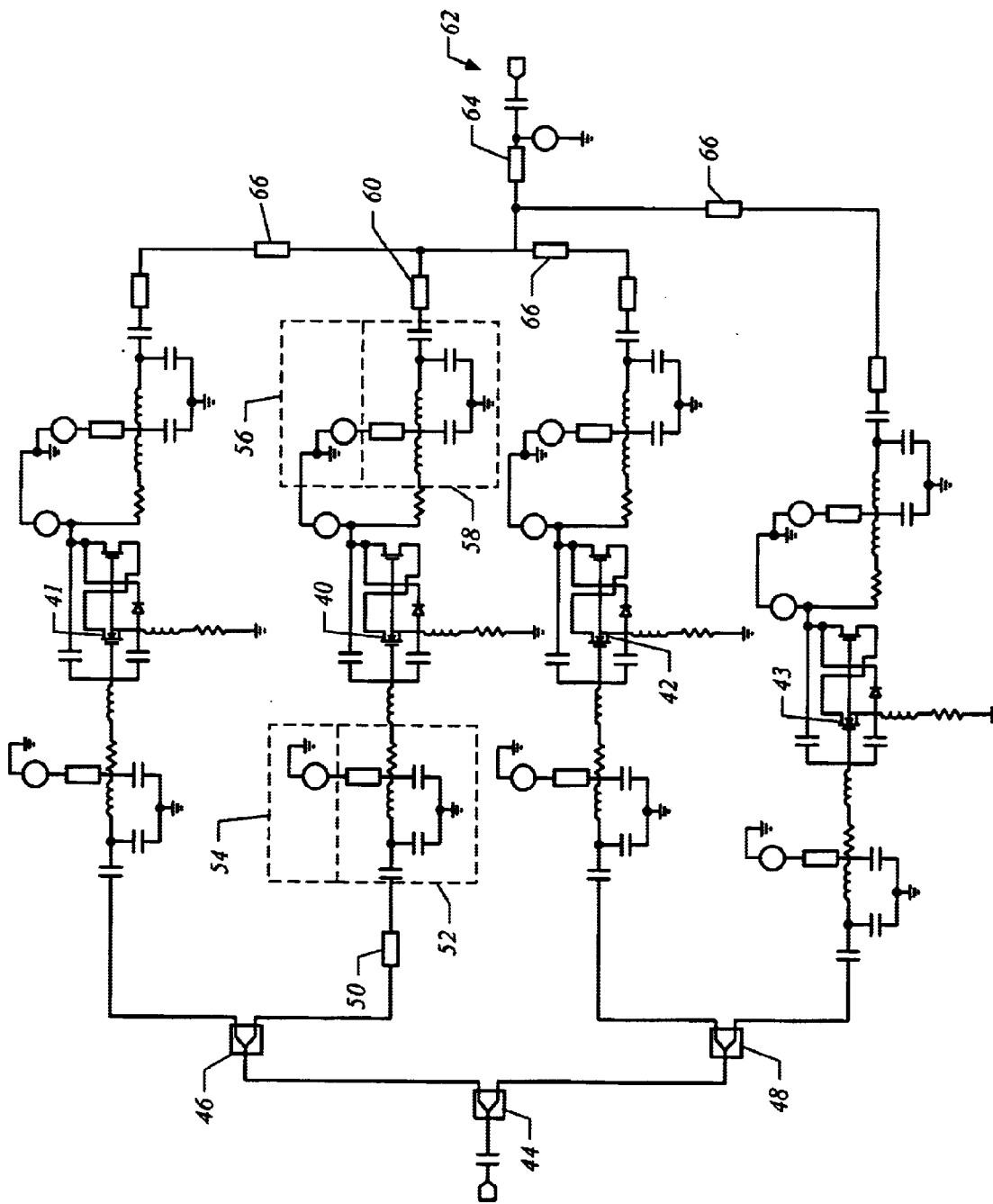
FIG. 3 is a more detailed schematic of a four-way amplifier in accordance with FIG. 2.

FIG. 3 is a more detailed schematic of an amplifier circuit in accordance with FIG. 2 which has been simulated using 30 watt LDMOSFET power transistors from Cree Microwave, Inc., including a carrier amplifier transistor 40 and three peak amplifier transistors 41, 42, 43. Four-way splitting of the input signals is provided by two-way splitters 44, 46, and 48. Carrier amplifier transistor 40 includes a 90° transformer 50 which connects splitter 46 to input matching circuit 52. Gate bias 54, drain bias 56, an output matching circuit 58, and an offset microstrip phase length 60 serially connect the amplifier between phase splitter 46 and the output at 62 including a transformer 64 and resistive load 65. Each of the peak amplifiers has a 90° transformer 66 connecting the amplifier circuitry to the load, as shown in FIG. 2. A harmonic termination, e.g., grounded inductor and capacitor, can be included in output matching circuit 58 to reflect output harmonics back into the transistor output and hence increase peak efficiency. Each of the peak amplifier circuits has similar input and output circuits with the gate bias circuits providing sequential operation of the peak amplifiers as input signal strength increases.

Figure 4:
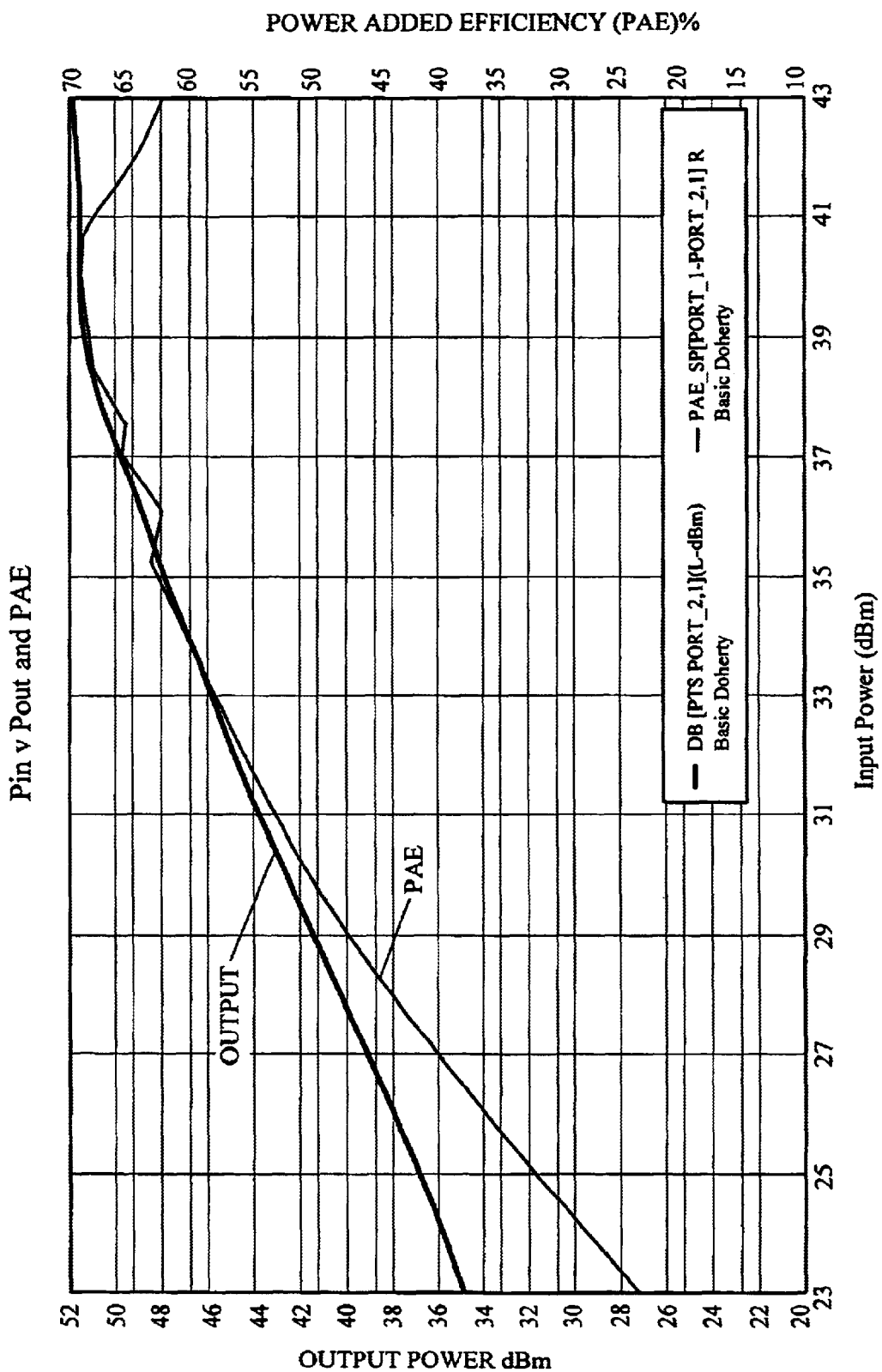
FIG. 4 is a graph illustrating power-out versus power-in and power added efficiency for a simulated power amplifier according to FIGS. 2 and 3.

The four-way amplifier circuit of FIG. 3 was simulated using an Applied Wave Research Microwave Office Simulator over the UMTS band (2110 to 2170 MHz) for output power, power added efficiency (PAE), and gain. FIG. 4 shows input RF power versus output RF power, as well as PAE over a range of input powers extending from 23 to 43 dBm (200 milliwatts to 20 watts) with a saturated output close to 150 watts (52 dBm). When the output power level is backed off to 42 dBm (10 dB back-off) the PAE is 46%. A conventional (i.e. non-Doherty) amplifier circuit would have a PAE of less than 10% for the same back-off power. A two-way Doherty amplifier circuit may have a corresponding PAE of 23%. It is important in the selection of the bias voltages for the peak amplifiers that the transistors turn on sequentially at the correct points to maintain gain linearity over the full dynamic range of the amplifier.

Table 1 shows a comparison between a conventional two-way Doherty amplifier circuit, a two-way Doherty amplifier circuit with unequal power split as described by Iwamoto et al., a three-way (a carrier amplifier with two peak amplifiers) in accordance with an embodiment of the invention, and a four-way split (a carrier amplifier with three peak amplifiers). It will be noted that the four-way amplifier achieves improvement in PAE at 10 dB back-off by a factor of about 2 over a 2-way Doherty approach.

the peak amplifier with a higher signal level compared with the carrier amplifier. Such an unequal power split allows the peak amplifier to be "pumped" by the RF signal more efficiently than in an equal split version, thus compensating for the transconductance characteristics of the transistor close to threshold.

Figure 5:
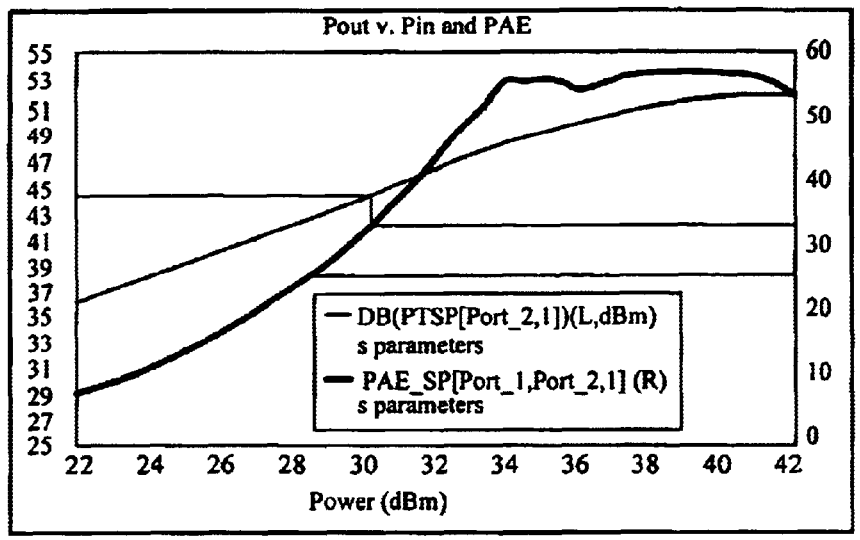
FIG. 5 is a graph illustrating power in versus power out and PAE for an equal input signal split 180 watt Doherty amplifier circuit.
Figure 6:
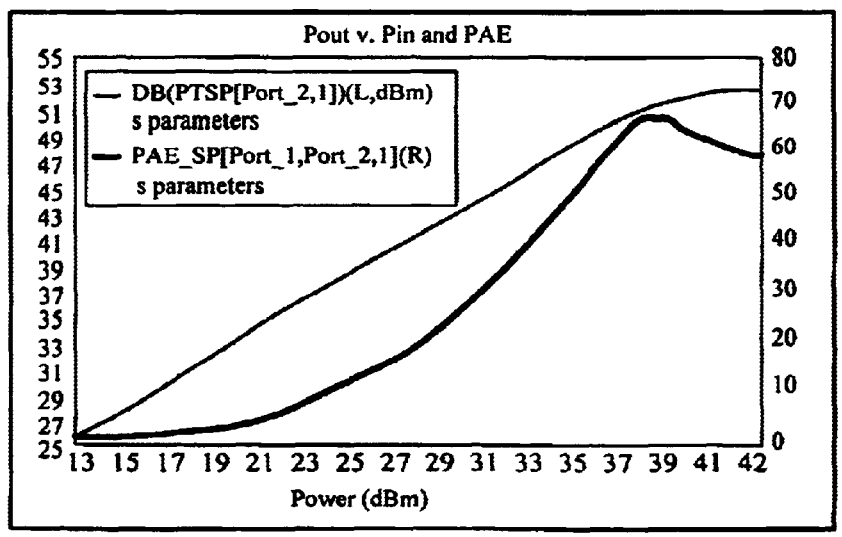
FIG. 6 is a graph illustrating input power versus output power and PAE for a 180 watt Doherty amplifier circuit having unequal input power split.

FIGS. 5 and 6 are graphs illustrating power in versus power out and PAE for a 180 watt Doherty amplifier circuit having one carrier and one peak amplifier. In FIG. 5 the performance of the Doherty amplifier circuit with equal split shows that PAE at 7 dB back-off is 34%, and PAE at 9 dB back-off is 27%. However, by using an unequal power split with −1.8 dB applied to the peak amplifier and −4.8 dB applied to the carrier amplifier, an improvement in PAE at 7 dB back-off of 3% to 37% is realized. The unequal power split enables the peak amplifier to be biased at threshold and thus realize the PAE improvement.

Figure 7:
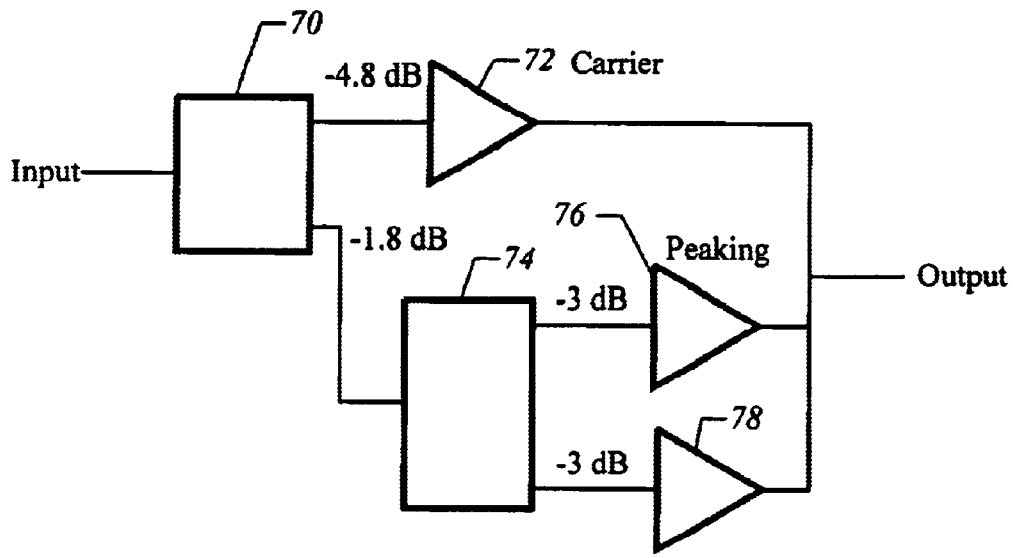
FIG. 7 is a schematic of a three-way 90 watt Doherty amplifier circuit with unequal power split.

Consider now a three-way 90 watt Doherty amplifier circuit with unequal power split as illustrated schematically in FIG. 7. By using a power divider 70, −4.8 dB of input power is applied to carrier amplifier 72 while a −1.8 dB of input power is applied to divider 74 which in turn applies −3 dB of input signal to peak amplifier 76 and −3 dB of input power to peak amplifier 78. Each of the amplifiers will have a different input gate bias, for example, with certain LDMOS transistors 4.3 volts may be applied to carrier 72 and 4.1 volts and 3.0 volts applied respectively to peak amplifiers 76

TABLE 1

| Configuration | SS Gain, dB | Pl dB, dBm | PAE @ Pl dB, % | PAE @ 7 dB back-off, % | PAE @ 10 dB back-off, % | Circuit Complexity |
| --- | --- | --- | --- | --- | --- | --- |
| 180 watt two-way Doherty with unequal power split | 13.5 | 52 | 65 | 31.5 | 20.3 | Medium |
| 3 × 60 watt two-way Doherty with selected phase lengths | 11 | 53.2 | 55 | 32 | 23 | High |
| 2 × 90 watt three-way Doherty | 11 | 52.4 | 62 | 45 | 35 | High |
| 2 × 120 watt four-way Doherty | 11 | 53.9 | 63 | 52 | 44 | High |

An N-way Doherty amplifier circuit in accordance with embodiments of the invention may give improvements in power added efficiency for linear power amplifiers over a wide range of input/output power levels. The amplifier may be particularly suitable for high power amplifiers because the power requirement of each transistor is inversely proportional to the number of power transistors N. In a two-way Doherty configuration, the peak power requirement of each transistor is forced to be one-half of the total output power. Such a condition leads to very low input and output impedances for the carrier and peak amplifiers and leads to practical realization difficulties. In an N-way Doherty amplifier circuit, each transistor needs to have a peak power requirement of 1/N output power, thus leading to higher input and output impedances when N is greater than 2. In addition, the heat generated by the remaining inefficiency in the amplifier is distributed over a larger physical area due to the use of smaller individual transistors, thus reducing total thermal resistance.

In accordance with another embodiment of the invention, input power is split and applied unequally to the carrier and one or more peak amplifiers to realize increased power added efficiency (PAE) and linearity.

In a conventional Doherty power amplifier circuit, equal signal levels are delivered to the so-called carrier and peak amplifiers. Since the peak amplifier bias point is purposely set to be close to threshold it can be advantageous to drive and 78. The voltage bias levels for peak amplifiers 76 and 78 were chosen such that peak amplifier 76 would begin to turn on just as the carrier amplifier 72 would begin to saturate, and peak amplifier 78 would begin to turn on just as the amplifier circuit comprising carrier amplifier 72 and peak amplifier 76 would begin to saturate, i.e. after about 6 dB of additional RF input power is applied to the circuit from the point where the peak amplifier 76 became active. Ideally, the voltage bias levels for peak amplifiers 76 and 78 are selected to maximize linearity and/or efficiency of the output power versus input power over the largest possible range.

Figure 8:
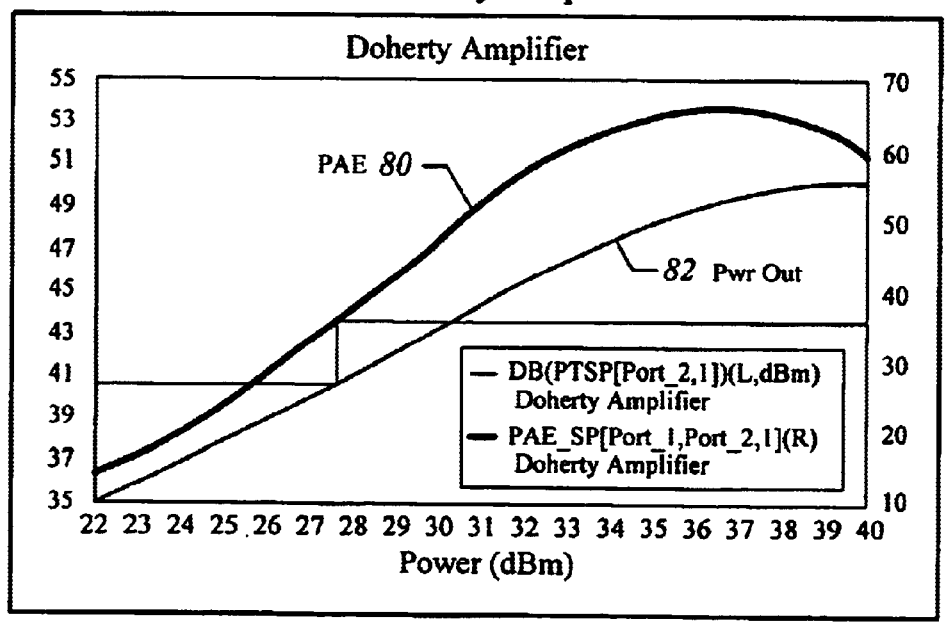
FIG. 8 is a graph illustrating input power versus output power and PAE for the amplifier of FIG. 7.

Simulated performance of the amplifier of FIG. 7 is illustrated in the graph of FIG. 8 in which input power is plotted against output power and PAE, with curve 80 representing PAE and curve 82 representing power out for the simulated Doherty amplifier circuit. It will be noted that PAE at 7 dB back-off is 45% with power of 90 watts and PAE at 9 dB back-off is 35% with power of 90 watts.

Figure 9:
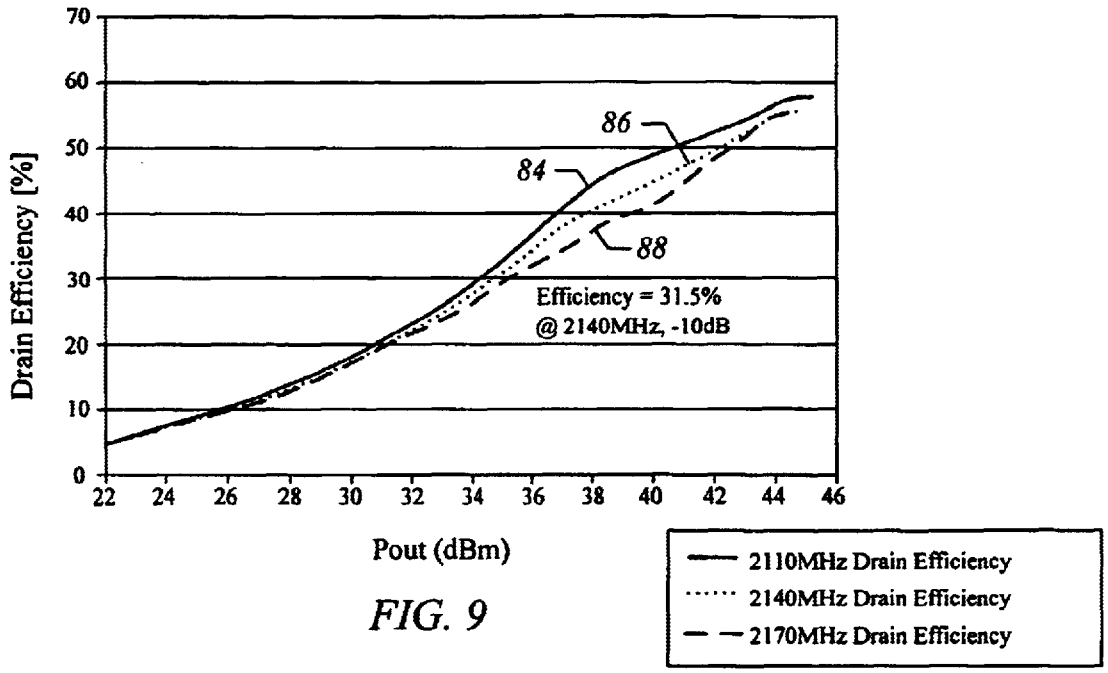
FIG. 9 is a graph illustrating drain efficiency versus output power over frequency for a two-way 20 watt unequal split Doherty amplifier circuit.

FIG. 9 is a graph illustrating drain efficiency versus output power over several frequency ranges using a two-way 20 watt unequal split amplifier having a Wilkinson power divider configured to provide −4.77 dB of input power to the carrier amplifier and −1.77 dB of input power to the peak amplifier. The simulated amplifier had a gain of 10.5+/−0.75 dB, and input return loss greater than 7 dB, efficiency at 6 dB of 42%, and efficiency at 10 dB back-off of 31.5%. Intermodulation components at 2 watts average was less than −36 dBc. In FIG. 9 the drain efficiency (percentage) versus power out (dBm) is plotted for 2110 MHz, 2140 MHz and 2170 MHz frequencies.

Figure 10:
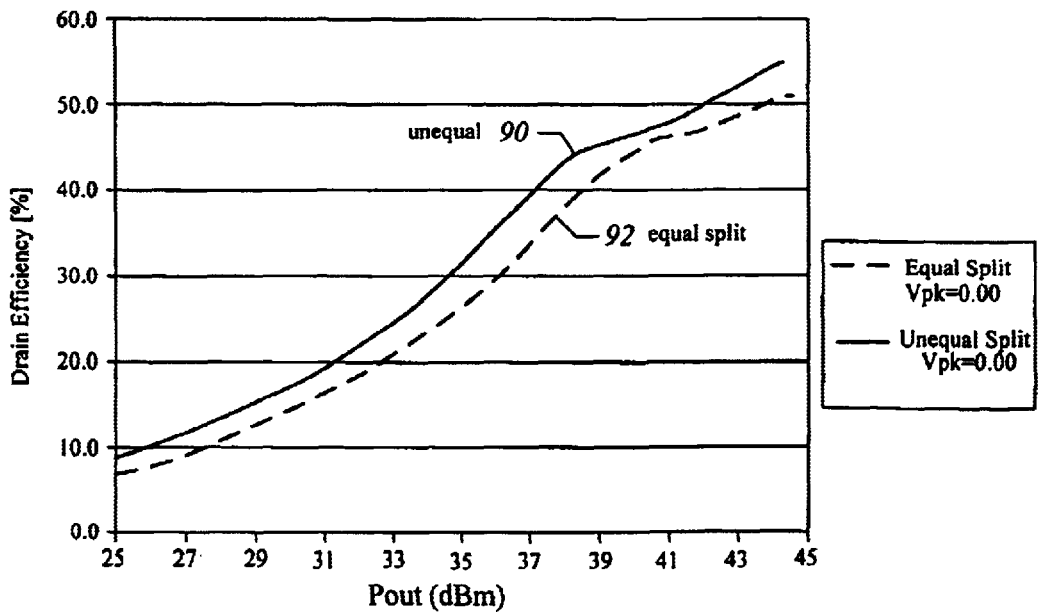
FIG. 10 is a graph illustrating a comparison of an efficiency curve for equal and unequal split two-way Doherty amplifier circuits.

FIG. 10 is a plot illustrating a comparison of efficiency curves for equal and unequal split two-way Doherty amplifier circuits with the unequal split shown at 90 and the equal split shown at 92. Here the performance is for a two-way 20 watt unequal split using Anaren power dividers. The amplifier gain is 11.3+/−0.2 dB, input return loss of greater than 11 dB, efficiency at 6 dB back-off equals 40.5%, and efficiency at 10 dB back-off equals 30%. The intermodulation components at 2 watts average was less than −32 dBc.

Here the efficiencies were measured under wide band code division multiple access (W-CDMA) digital modulation as per 3GPP standard. The efficiency measurement shows the critical relationship between backed off efficiency and linearity of the Doherty amplifier circuit. Comparisons were made at 2 watt average power out for a single transistor (13% efficiency), a two-way Doherty amplifier circuit with equal input power split (22.3% efficiency) and a two-way Doherty amplifier circuit with unequal input power split (27.2% efficiency). Thus it is seen that a Doherty amplifier circuit provides increased efficiency over a single transistor amplifier and the Doherty amplifier circuit with unequal power split can provide enhanced efficiency, and linearity at a given back-off power.

The same design consideration can be used in the case of asymmetric Doherty amplifier circuits where the size of the RF transistors in the carrier and peak amplifiers are different. In all cases, optimization of input power division between the carrier and peak amplifier allows improvements in gain, efficiency and linearity of the complete power amplifier. While the invention has been described with reference to high power, high efficiency and high linearity RF and microwave amplifiers using silicon LDMOSFETs, the invention can be implemented using a wide range of semiconductor technologies such as silicon bipolar, gallium arsenide MESFET, indium gallium phosphide HBT, silicon carbide MESFET and gallium nitride HEMT.

While the invention has been described with reference to a specific four-way embodiment, the description is illustrative of the invention and is not to be construed as limiting the invention. Various modifications and applications may occur to those skilled in the art without departing from the true spirit and scope of the invention as defined by the appended claims.

What is claimed is:

1. An RF power amplifier circuit for amplifying an RF signal over a broad range of power comprising:
   a) a carrier amplifier for amplifying the RF signal over a first range of power and with a power saturation level below the maximum of the first range of power,
   b) a plurality of peak amplifiers connected in parallel with the carrier amplifier, each of the peak amplifiers being biased to sequentially provide an amplified output signal after the carrier amplifier approaches saturation,
   c) a signal splitter for splitting an input signal and applying the split input signal to the carrier amplifier and to the plurality of peak amplifiers, the input signal power to the carrier amplifier being different from the total input signal power to all of the peak amplifiers, and
   d) an output for receiving and combining amplified output signals from the carrier amplifier and from the plurality of peak amplifiers.

2. The RF power amplifier circuit as defined by claim 1, wherein input power to the carrier amplifier is greater than the input power to all peak amplifiers.

3. The RF power amplifier circuit as defined by claim 1, wherein input power to the carrier amplifier is less than the total input power to all peak amplifiers.

4. The RF power amplifier circuit as defined by claim 1, wherein each peak amplifier extends the range of efficient power amplification by 6 dB.

5. The RF power amplifier circuit as defined by claim 4, wherein the plurality of peak amplifiers comprises three peak amplifiers and the extended efficient power amplification is approximately 18 dB.

6. The RF power amplifier circuit as defined by claim 1, wherein the signal splitter includes a quarter-wave transformer connected to the input of the carrier amplifier, and the output includes a resistive load connected to the output of the carrier amplifier and connected to the output of each peak amplifier through a quarter-wave transformer.

7. The RF power amplifier circuit as defined by claim 1, wherein the signal splitter includes a quarter-wave transformer connected to the output of the carrier amplifier, and the output includes a resistive load connected to the output of the carrier amplifier through the quarter-wave transformer and connected to the output of each peak amplifier.

8. The RF power amplifier circuit as defined by claim 7, wherein the resistive load is R/2 and each amplifier is connected to the load through a quarter-wave transmission line of characteristic impedance R.

9. The RF power amplifier circuit as defined by claim 8, wherein below saturation the carrier amplifier provides current to an apparent load of 2R whereby current is one-half of maximum power current when the amplifier is saturated.

10. The RF power amplifier circuit as defined by claim 1, wherein the output includes a resistive load connected to the output of the carrier amplifier and connected to the output of each peak amplifier through a quarter-wave transformer.

11. The RF power amplifier circuit as defined by claim 1, wherein the output includes a resistive load connected to the output of the carrier amplifier through a quarter-wave transformer and connected to the output of each peak amplifier.

12. The RF power amplifier circuit as defined by claim 11, wherein the resistive load is R/2 and each amplifier is connected to the load through a quarter-wave transmission line of characteristic impedance R.

13. The RF power amplifier circuit as defined by claim 12, wherein below saturation the carrier amplifier provides current to an apparent load of 2R whereby current is one-half of maximum power current for when the amplifier is saturated.

14. An RF power amplifier circuit for amplifying an RF signal over a broad range of power comprising:
   a) a carrier amplifier for amplifying the RF signal over a first range of power and with a power saturation level below the maximum of the first range of power,
   b) at least one peak amplifier connected in parallel with the carrier amplifier, the at least one peak amplifier being biased to begin amplification after the carrier amplifier approaches saturation, and
   c) a signal splitter for splitting an input signal unequally and applying the split input signal to the carrier amplifier and to the at least one peak amplifier.

15. The RF power amplifier circuit as defined by claim 14 wherein the carrier amplifier receives less input signal power than does the at least one peak amplifier.

16. The RF power amplifier circuit as defined by claim 14 wherein the carrier amplifier receives more input signal power than does the at least one peak amplifier.

17. An RF power amplifier circuit for amplifying an RF signal over a broad range of power comprising:

a) a carrier amplifier comprising a first transistor for amplifying the RF signal over a first range of power and with a power saturation level below the maximum of the broad range of power, b) at least one peak amplifier comprising a second transistor connected in parallel with the carrier amplifier, the second transistor being biased to begin amplification after the first transistor approaches saturation, and c) a signal splitter for splitting an input signal unequally and applying the split input signal to the carrier amplifier and to the at least one peak amplifier.

18. The RF power amplifier circuit as defined by claim 17 wherein the carrier amplifier receives less input signal than does the at least one peak amplifier.

19. The RF power amplifier circuit as defined by claim 17 wherein the first transistor differs in size from the second transistor.

20. The RF power amplifier circuit of claim 19 wherein the first transistor is smaller in size than is the second transistor.

* * * * *